(12) United States Patent
Lee et al.

(10) Patent No.: US 10,100,164 B2
(45) Date of Patent: Oct. 16, 2018

(54) MULTILAYER THIN FILM MANUFACTURING METHOD AND ELECTRONIC PRODUCT

(71) Applicant: SAMSUNG ELECTRONICS CO., LTD., Suwon-si (KR)

(72) Inventors: Seo Joon Lee, Suwon-si (KR); Jin Sub Kim, Yongin-si (KR); Hyong Jun Yoo, Hwaseong-si (KR); Min Chul Jung, Pyeongtaek-si (KR); Jin Hyun Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 889 days.

(21) Appl. No.: 14/530,208

(22) Filed: Oct. 31, 2014

(65) Prior Publication Data
US 2015/0125640 A1    May 7, 2015

(30) Foreign Application Priority Data
Nov. 1, 2013    (KR) .......................... 10-2013-0131918

(51) Int. Cl.
| | |
|---|---|
| *C23C 14/00* | (2006.01) |
| *C08J 7/04* | (2006.01) |
| *C23C 14/02* | (2006.01) |
| *C23C 14/56* | (2006.01) |

(52) U.S. Cl.
CPC ........... *C08J 7/045* (2013.01); *C23C 14/0015* (2013.01); *C23C 14/025* (2013.01); *C23C 14/568* (2013.01); *C08J 2300/00* (2013.01); *C08J 2427/18* (2013.01); *Y10T 428/13* (2015.01); *Y10T 428/1352* (2015.01)

(58) Field of Classification Search
USPC ................ 428/623, 689; 204/192.13, 192.26
See application file for complete search history.

(56) References Cited

U.S. PATENT DOCUMENTS

| | | | | |
|---|---|---|---|---|
| 4,772,080 | A * | 9/1988 | Tustison | ................. C23C 28/00 204/192.26 |
| 5,151,295 | A * | 9/1992 | Kawahara | ................. G11B 7/26 204/192.13 |
| 2004/0142205 | A1* | 7/2004 | Chen | ...................... B05D 5/067 428/689 |
| 2013/0143063 | A1* | 6/2013 | Cao | ....................... H05K 5/0243 428/623 |

* cited by examiner

*Primary Examiner* — Timon Wanga
(74) *Attorney, Agent, or Firm* — Sughrue Mion, PLLC

(57) ABSTRACT

A manufacturing method that forms a multilayer thin film on the inner surface of a housing forming a transparent appearance of an electronic product to provide a deep metal texture and an electronic product having a metal texture provided at the inner surface of the housing. The multilayer thin film manufacturing method includes reforming an inner surface of a housing having an outer surface and the inner surface through plasma processing, depositing at least one hardness reinforcement layer on the inner surface, and depositing a color layer on the hardness reinforcement layer.

13 Claims, 12 Drawing Sheets

(a)

(b)

(a)

(b)

MULTILAYER THIN FILM MANUFACTURING METHOD AND ELECTRONIC PRODUCT

CROSS-REFERENCE TO RELATED APPLICATION

This application claims the benefit of Korean Patent Application No. 10-2013-0131918, filed on Nov. 1, 2013 in the Korean Intellectual Property Office, the disclosure of which is incorporated herein by reference.

BACKGROUND

1. Field

Exemplary embodiments relate to a method of depositing a multilayer thin film on the inner surface of a housing of a product to provide a deep metal texture to the exterior of the product.

2. Description of the Related Art

Plastic is lighter than metal and has a high degree of freedom in shaping. Consequently, a complicated form may be manufactured at low cost using plastic. In recent years, attempts to provide a metal texture using a plastic base material have been made.

Plating, hot stamping, and coating may be performed on the plastic base material to provide a metal texture. Generally, a method of thinly coating a metallic paint or a method of coating a semitransparent resin is mainly used.

In a case in which a semitransparent metal texture is provided to an injected product using a coating, which is generally used, the thickness of a coating film is increased with the result that it may be difficult to provide a semitransparent texture. For this reason, paints may be mixed to provide a semitransparent color and, in addition, it may be necessary to additionally use a transparent paint.

Meanwhile, a method of coloring a transparent resin to manufacture a semitransparent plastic product has been used for a long time. However, a thin metal film does not provide a deep texture and has the same color at all angles. There exists a method of varying the thickness of a transparent injected product to provide a gradation effect. However, this method does not sufficiently provide a metal film texture.

SUMMARY

It is an aspect of the exemplary embodiments to provide a multilayer thin film manufacturing method that forms a multilayer thin film on the inner surface of a housing to provide a deep metal texture to the outer surface of the housing forming the external appearance of a product.

It is another aspect of the exemplary embodiments to provide a multilayer thin film manufacturing method that replaces a masking process by mounting a product in a multilayer thin film deposition apparatus.

It is a further aspect of the exemplary embodiments to provide an electronic product having a multilayer thin film formed on the inner surface of a housing.

Additional aspects of the invention will be set forth in part in the description which follows and, in part, will be obvious from the description, or may be learned by practice of the exemplary embodiments.

In accordance with an aspect of an exemplary embodiment, a multilayer thin film manufacturing method includes reforming an inner surface of a housing having an outer surface and the inner surface through plasma processing, depositing at least one hardness reinforcement layer on the inner surface, and depositing a color layer on the hardness reinforcement layer.

The multilayer thin film manufacturing method may further include mounting the housing in a multilayer thin film manufacturing apparatus such that the outer surface of the housing is masked before reforming the inner surface of the housing.

The depositing the hardness reinforcement layer may include depositing a first hardness reinforcement layer including chromium (Cr) on the inner surface and depositing a second hardness reinforcement layer including at least one selected from a group consisting of titanium nitride (TiN), chromium nitride (CrN), and aluminum nitride (AlN) on the first hardness reinforcement layer.

The depositing the first hardness reinforcement layer may include providing a target sample including chromium (Cr) and supplying power to the multilayer thin film manufacturing apparatus.

The depositing the second hardness reinforcement layer may include providing a target sample including at least one selected from a group consisting of aluminum (Al), chromium (Cr), and titanium (Ti), injecting a reaction gas including nitrogen ($N_2$), and supplying power to the multilayer thin film manufacturing apparatus to enable the target sample and the reaction gas to react with each other.

The multilayer thin film manufacturing method may further include depositing a passivation layer on the color layer after depositing the color layer on the hardness reinforcement layer.

In accordance with another exemplary embodiment, an electronic product includes a housing having an outer surface and an inner surface and a multilayer thin film partially coupled to the inner surface, wherein the multilayer thin film includes at least one hardness reinforcement layer at least partially coupled to the inner surface of the housing and a color layer coupled to the hardness reinforcement layer.

The housing may form an external appearance of at least one selected from a transparent product group consisting of a glass product, a plastic product, and a dual injected product.

The outer surface may be exposed outward to form the external appearance of the electronic product.

The housing may include a housing accessory.

The hardness reinforcement layer may include a first hardness reinforcement layer coupled to the inner surface of the housing and a second hardness reinforcement layer coupled to the first hardness reinforcement layer.

The first hardness reinforcement layer may include chromium, and the second hardness reinforcement layer may include at least one selected from a group consisting of titanium nitride (TiN), chromium nitride (CrN), and aluminum nitride (AlN).

The color layer may include at least one selected from a group consisting of chromium (Cr), titanium (Ti), copper (Cu), gold (Au), and titanium nitride (TiN).

The multilayer thin film may further include a passivation layer coupled to the color layer, the passivation layer including at least one selected from a group consisting of polytetrafluoroethylene (PTFE) and silicon dioxide ($SiO_2$).

In accordance with another exemplary embodiment, a multilayer thin film manufacturing method includes depositing at least one hardness reinforcement layer on an inner surface of a housing, and depositing a color layer on the hardness reinforcement layer, where the depositing the at least one hardness reinforcement layer and the depositing the color layer includes plasma processing.

The depositing the at least one hardness reinforcement layer may include depositing a first hardness reinforcement layer on the inner surface and depositing a second hardness reinforcement layer on the first hardness reinforcement layer.

The first hardness reinforcement layer may include chromium and the second hardness reinforcement layer includes at least one selected from a group consisting of titanium nitride (TiN), chromium nitride (CrN), and aluminum nitride (AlN).

The method may further include depositing a passivation layer on the color layer.

The passivation layer may include chromium.

The film manufacturing method may include using a sputtering deposition apparatus.

BRIEF DESCRIPTION OF THE DRAWINGS

These and/or other aspects of the exemplary embodiments will become apparent and more readily appreciated from the following description of the exemplary embodiments, taken in conjunction with the accompanying drawings of which.

DETAILED DESCRIPTION

Figure 1:
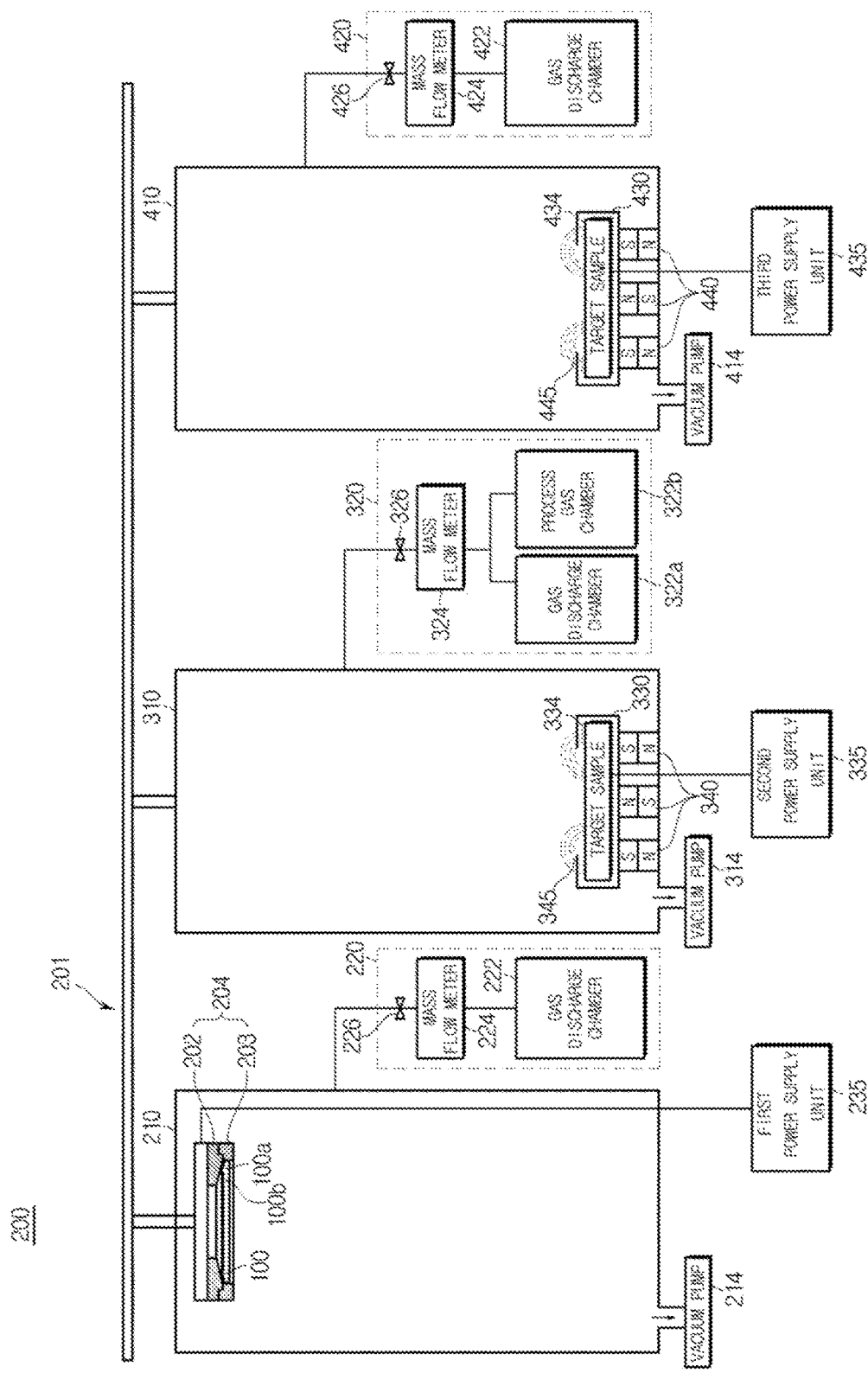
FIG. 1 is a view showing the construction of a sputtering deposition apparatus to manufacture a multilayer thin film according to an exemplary embodiment.

Exemplary embodiments described in this specification and constructions shown in the drawings are merely preferred embodiments and there may be various modifications which may replace the exemplary embodiments and the drawings of this specification at the time of filing the present application.

Now, exemplary embodiments will be described in detail with reference to the annexed drawings.

A multilayer thin film manufacturing method using a sputtering deposition apparatus according to an exemplary embodiment includes reforming an inner surface of a housing, having an outer surface, and the inner surface through plasma processing, depositing at least one hardness reinforcement layer on the inner surface, and depositing a color layer on the hardness reinforcement layer. The plasma processing and the multilayer thin film manufacturing method may be performed through a sputtering process. In this specification, therefore, a multilayer thin film manufacturing apparatus may include a sputtering deposition apparatus.

The sputtering process is a typical physical vapor deposition process. In the sputtering process, an inert gas is accelerated in a vacuum chamber such that the inert gas collides with a solid sample and atoms rush out of the solid sample due to energy generated during collision. Generally, the sputtering process may be used to form a thin metal film layer or to deposit a metal oxide layer necessary in the manufacture of a semiconductor and a display device.

Figure 2:
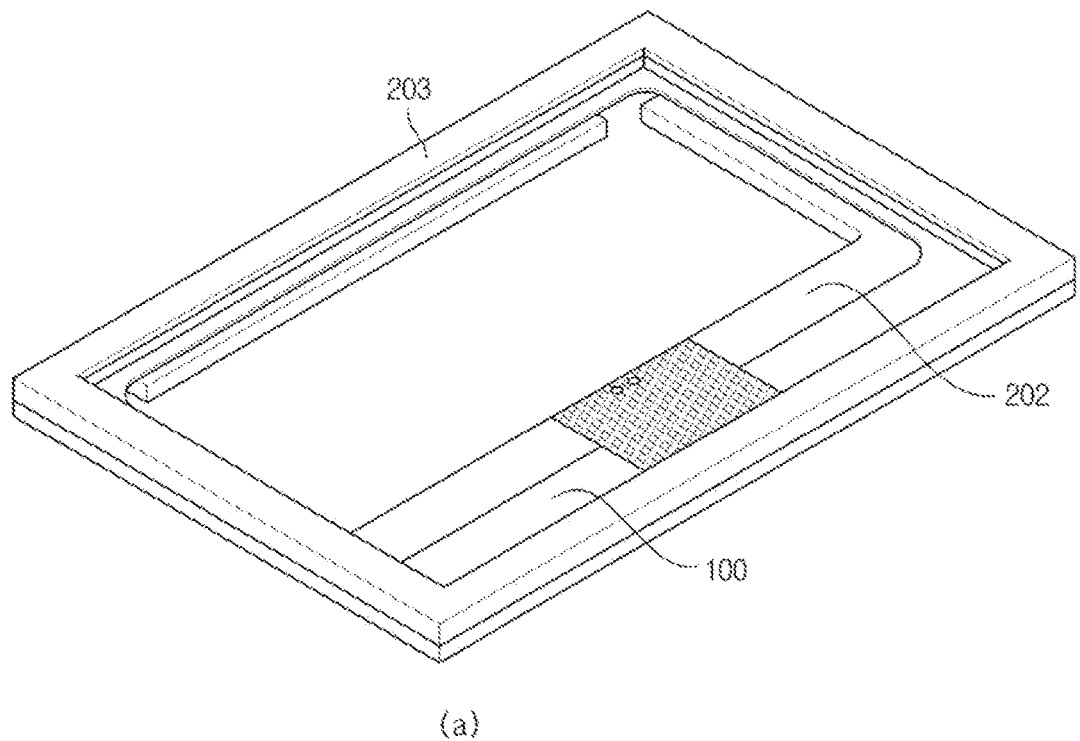
FIG. 2, views (a) and (b), are views showing a structure in which a television (TV) bezel is fixed to a jig.
Figure 2:
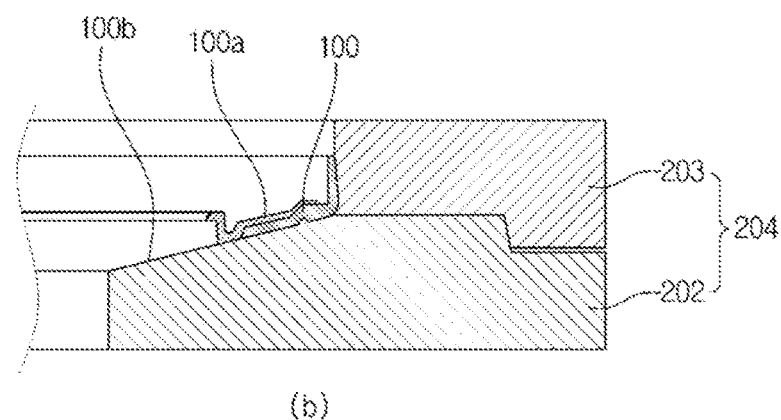

FIG. 1 is a view showing the construction of a sputtering deposition apparatus 200 to perform a multilayer thin film manufacturing method according to an embodiment of the present invention and FIG. 2 is a view showing a structure in which a television (TV) bezel is fixed to a jig 204 of the sputtering deposition apparatus 200. The sputtering deposition apparatus 200 as shown in FIG. 1 may be used to perform a multilayer thin film manufacturing method according to an embodiment of the present invention.

Referring to FIG. 1, the sputtering deposition apparatus 200 may include a plurality of vacuum chambers 210, 310, and 410, vacuum pumps 214, 314, and 414, gas supply systems 220, 320, and 420, a rail 201, target samples 334 and 434, guns 330 and 430, and a plurality of magnetrons 340 and 440.

The vacuum pumps 214, 314, and 414 may be provided at one side of the vacuum chambers 210, 310, and 410 to maintain a vacuum state in the vacuum chambers 210, 310, and 410.

The gas supply systems 220, 320, and 420 may be provided at sidewalls of the vacuum chambers 210, 310, and 410 to supply gas into the vacuum chambers 210, 310, and 410.

The gas supply systems 220, 320, and 420 may include gas discharge chambers 222, 322a, and 422 to store argon (Ar) to be ionized, a process gas chamber 322b to store a process gas, such as nitrogen ($N_2$), for plasma chemical deposition, mass flow meters 224, 324, and 424 connected between the vacuum chambers 210, 310, and 410 and the gas discharge chambers 222, 322a, and 422, and control valves 226, 326, and 426 to control gas introduced from the gas discharge chambers 222, 322a, and 422 to the vacuum chambers 210, 310, and 410. Meanwhile, the discharge gas discharge chambers 222, 322a, and 422 may store argon (Ar) or a mixture of argon (Ar) and another inert gas. Hereinafter, it is assumed that argon (Ar) is used as a discharge gas for the convenience of description.

The rail 201 is provided above the vacuum chambers 210, 310, and 410 to move a target to be deposited, on which a film is deposited. More specifically, the target to be deposited is moved along the rail 201 while being fixed to the jig 204.

In a multilayer thin film manufacturing method according to an exemplary embodiment, a target on which a multilayer thin film is to be deposited is a housing 100 forming the external appearance of a product, more specifically an inner surface 100a of the housing 100. The inner surface 100a of the housing may be flat or a portion of the surface of the housing may be curved or protruded. In addition, the housing 100 may form the external appearance of at least one selected from a transparent product group consisting of a glass product, a plastic product, and a dual injected product. In this exemplary embodiment, the multilayer thin film is deposited on the inner surface 100a of the housing 100.

Referring to FIGS. 2(a) and 2(b), a bezel 100, which is a target to be deposited, is provided to move along the rail 201 while being fixed in the upper parts of the vacuum chambers 210, 310, and 410 by a first jig 202 and a second jig 203. The outer surface 100b of the bezel forming the external appearance of the TV when the TV is assembled is fixed by the first jig 202 and the second jig 203. At the same time, the outer surface 100b of the bezel is isolated from surrounding air.

As a result, the multilayer thin film manufacturing method according to an exemplary embodiment may not include a process of masking the outer surface 100b of the bezel during deposition of the multilayer thin film. That is, the masking process may be replaced by fixing the bezel 100 to the jig 204 such that the jig 204 and the outer surface 100b of the bezel contact each other, thereby achieving process economy.

Figure 3A:
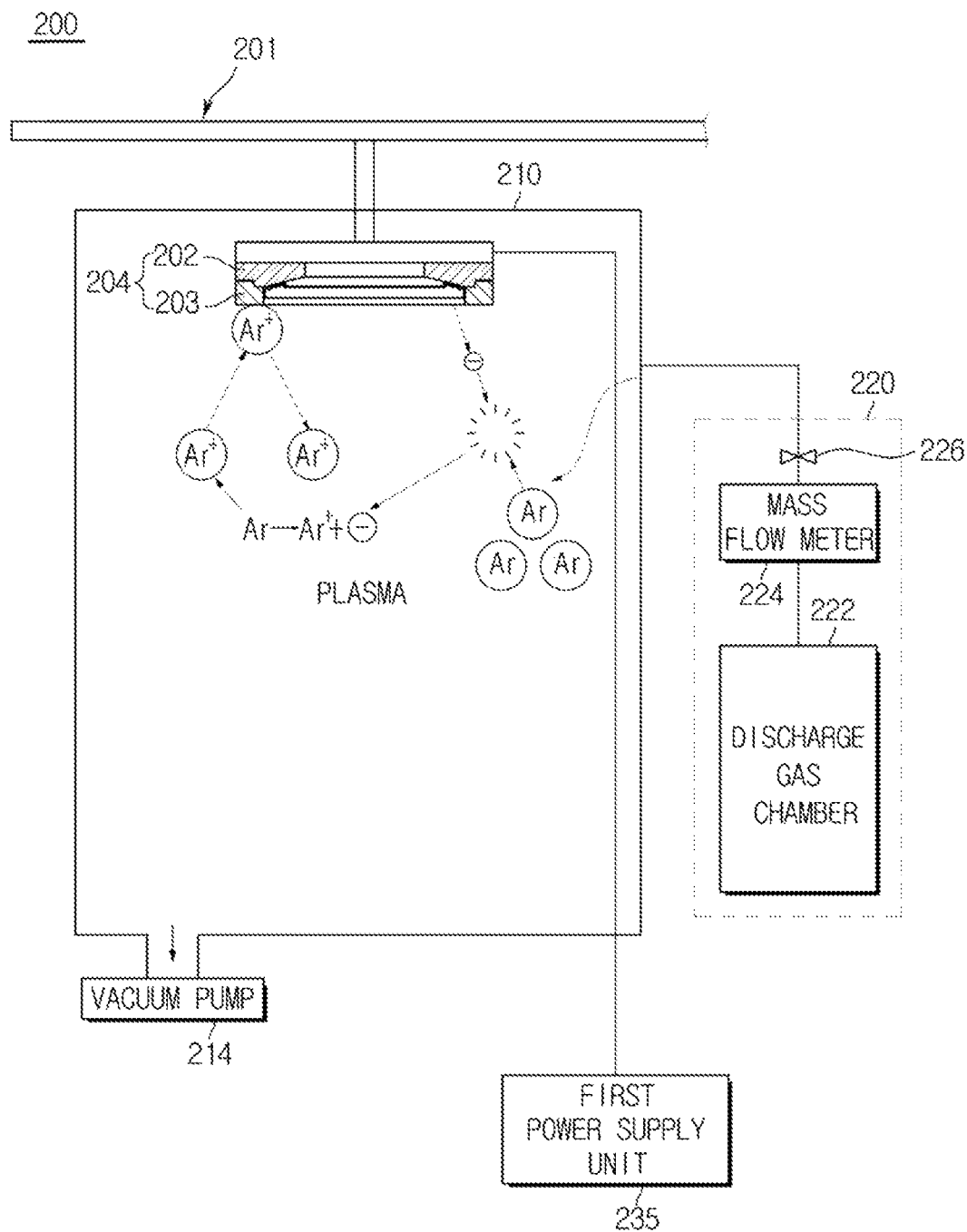
FIGS. 3A to 3C are views showing a multilayer thin film manufacturing method according to an exemplary embodiment using the sputtering deposition apparatus shown in FIG. 1.
Figure 3B:
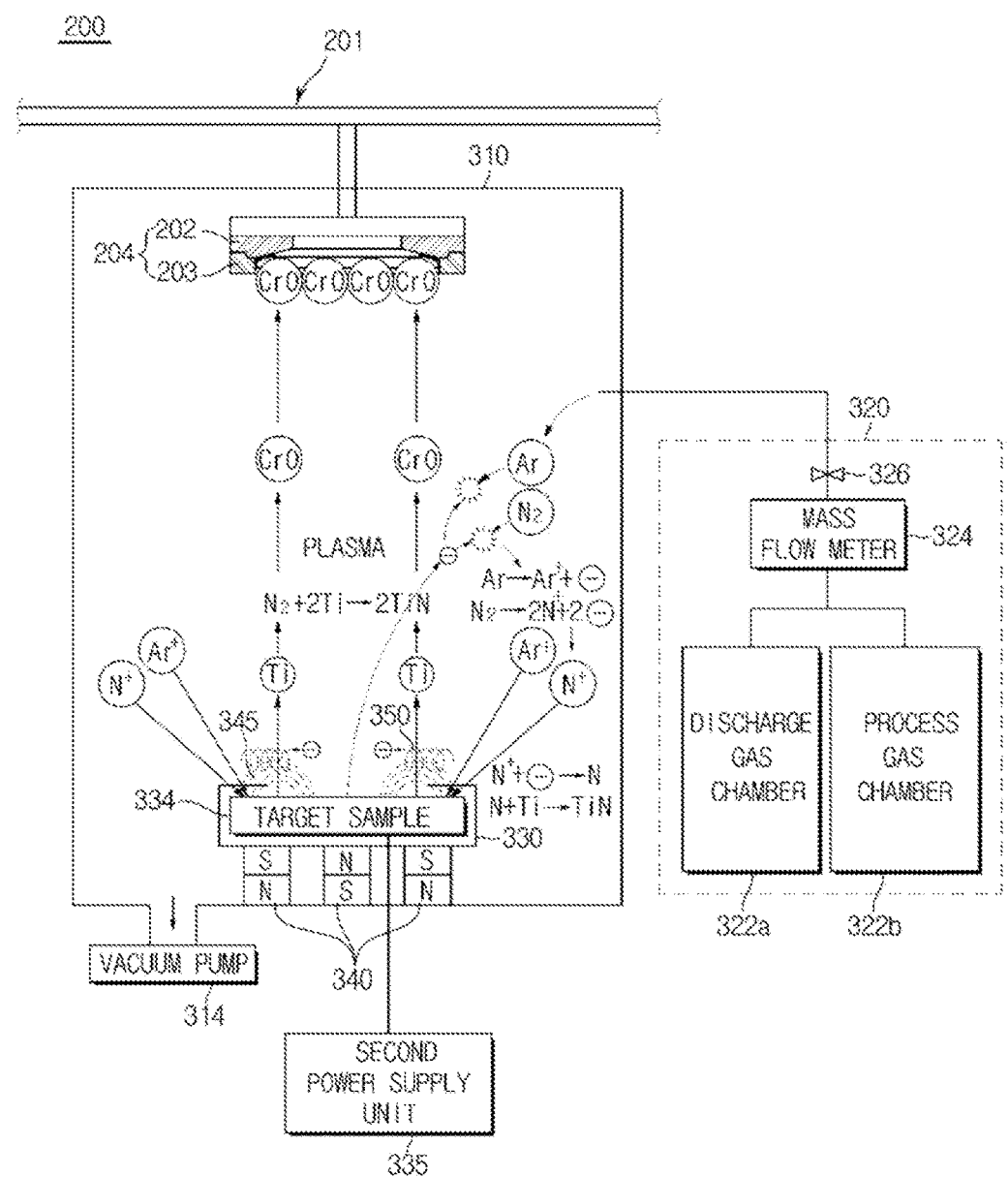
Figure 3C:
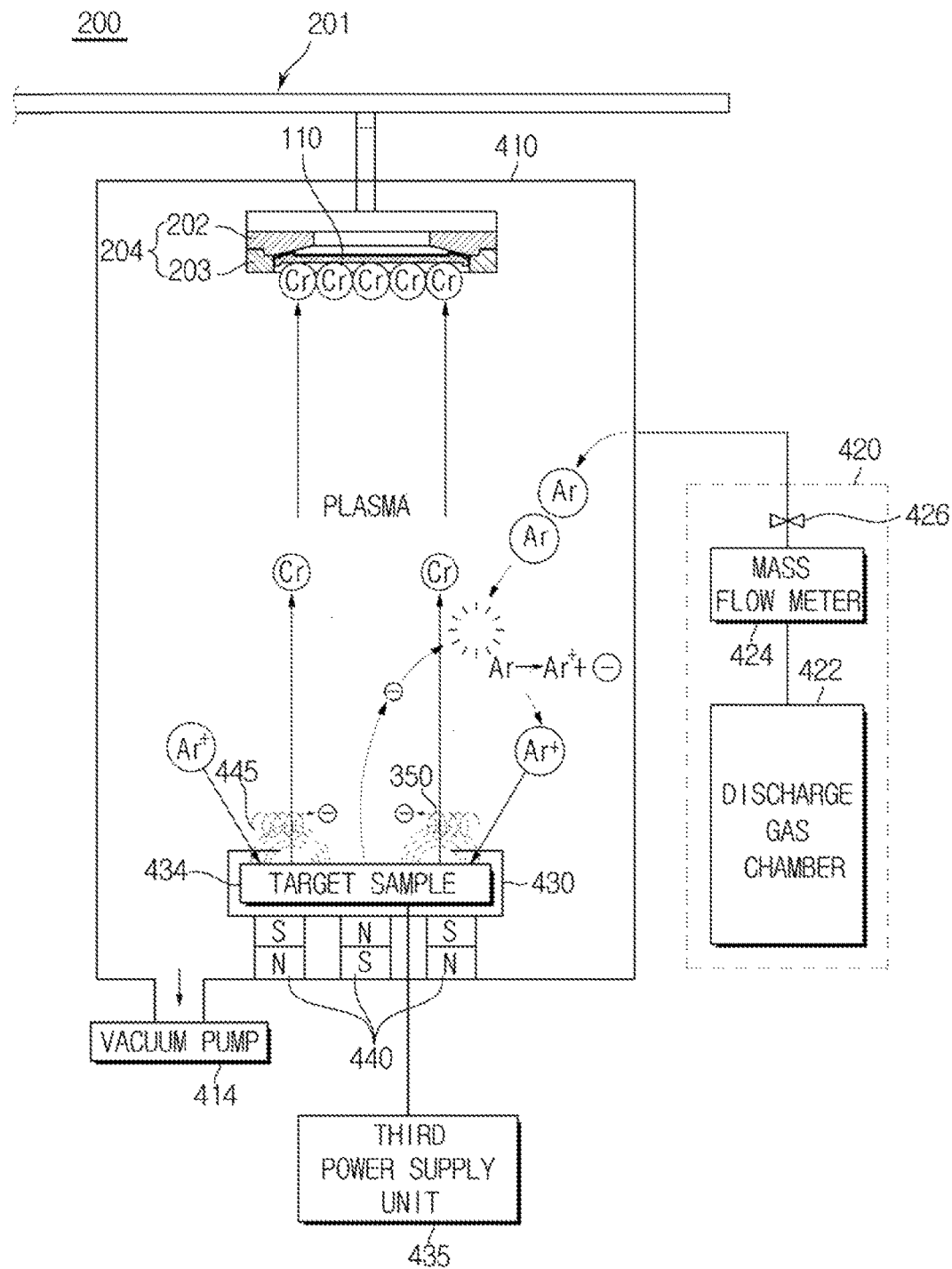

FIGS. 3A to 3C are views showing a multilayer thin film manufacturing method according to an exemplary embodiment using the sputtering deposition apparatus 200 shown in FIG. 1.

The multilayer thin film manufacturing method using the sputtering deposition apparatus 200 according to the exemplary embodiment includes reforming the inner surface 100a of the housing 100 having the outer surface 100b and the inner surface 100a through plasma processing, depositing at least one hardness reinforcement layer 110 on the inner surface 100a, and depositing a color layer 120 on the hardness reinforcement layer 110.

In addition, the multilayer thin film manufacturing method may further include mounting the housing 100 in the multilayer thin film manufacturing apparatus 200 such that the outer surface 100b of the housing is masked before reforming the inner surface 100a of the housing having the outer surface 100b and the inner surface 100a.

The process of depositing the at least one hardness reinforcement layer 110 on the inner surface 100a may include depositing a first hardness reinforcement layer including chromium (Cr) on the inner surface 100a and depositing a second hardness reinforcement layer including at least one selected from a group consisting of titanium nitride (TiN), chromium nitride (CrN), and aluminum nitride (AlN) on the first hardness reinforcement layer.

The process of depositing the first hardness reinforcement layer on the inner surface 100a may include providing a target sample including chromium (Cr) and supplying power to the multilayer thin film manufacturing apparatus. In addition, the process of depositing the second hardness reinforcement layer including the at least one selected from a group consisting of titanium nitride (TiN), chromium nitride (CrN), and aluminum nitride (AlN) on the first hardness reinforcement layer may include providing a target sample including at least one selected from a group consisting of aluminum (Al), chromium (Cr), and titanium (Ti), injecting a reaction gas including nitrogen ($N_2$), and supplying power to the multilayer thin film manufacturing apparatus and reacting the target sample and the reaction gas with each other.

Hereinafter, a multilayer thin film manufacturing method including depositing a hardness reinforcement layer 110 including titanium nitride (TiN) and depositing a color layer 120 including chromium (Cr) will be described according to an exemplary embodiment. As shown in FIGS. 3A to 3C, the multilayer thin film manufacturing method performed on the inside of the TV bezel 100 in the same manner as in FIG. 2 will be described by way of example.

During the plasma processing, the target samples 334 and 434 may be maintained at a temperature of room temperature (e.g., 20° C. to 26° C.) to 200° C. and the target to be deposited, which is moved along the rail 201, may be maintained at a temperature of 60° C. to 70° C.

The multilayer thin film manufacturing method will be described in more detail.

Referring to FIG. 3A, the multilayer thin film manufacturing method according to an exemplary embodiment includes submitting the bezel 100 to the first vacuum chamber 210 of the multilayer thin film manufacturing apparatus 200 using the jig 204 such that the outer surface 100b of the bezel is masked and plasma is applied under proper conditions to reform the inner surface 100a of the bezel 100.

When power is supplied to the sputtering deposition apparatus 200 through a first power supply unit 235 to generate a negative electric field, discharge is commenced in the first vacuum chamber 210 to generate plasma.

More specifically, argon (Ar) injected into the first vacuum chamber 210 is ionized as represented by Equation 1 below due to a collision with first and third electrons, thus generating plasma.

$$Ar \rightarrow Ar++-. \qquad \text{Equation 1:}$$

A DC power source, a pulsed DC power source, or a radio frequency (RF) power source may be used as a power supply device. An RF power source, which maximizes a reforming effect through plasma heating while preventing damage to the inner surface 100a of the bezel during plasma processing, may be used as the first power supply unit 235.

More specifically, the RF power source alternately changes power applied to the target from negative to positive and from positive to negative using a frequency of about 13.56 MHz. When the pole of the target, i.e., the inner surface 100a of the bezel, is negative, plasma argon ions (Ar+) are accelerated toward the inner surface 100a of the bezel. However, as the power is changed from negative to positive when the ions are about to stick to the surface after sputtering, the ions are separated from the inner surface 100a of the bezel. As a result, a plasma state is maintained. For this reason, the RF power source may be used to reform the inner surface 100a of the bezel, which is a nonconductor.

After the inner surface 100a of the bezel is reformed, a process of depositing a multilayer thin film on the inner surface 100a of the bezel through sputtering is performed.

More specifically, as shown in FIG. 3B, the plasma-processed bezel 100 is mounted in the second vacuum chamber 310 and a titanium (Ti) target sample 334 is located in the lower part of the second vacuum chamber 310 to deposit a hardness reinforcement layer 110 on the reformed inner surface 100a of the bezel. Subsequently, the mass flow meter 326 is controlled such that argon (Ar) and nitrogen ($N_2$) are introduced into the second vacuum chamber 310 while a vacuum state of the second vacuum chamber 310 is maintained by the vacuum pump 314. Subsequently, power is supplied to the gun 330 through a second power supply unit 335. As a result, discharge of the argon (Ar) and nitrogen ($N_2$) is commenced and reaction is performed as represented by Equation 1 above and Equation 2 below such that argon (Ar) and nitrogen (N₂) are simultaneously ionized to generate plasma.

$$N_2 \rightarrow 2N+. \quad \text{Equation 2:}$$

During the plasma generation, all nitrogen (N₂) molecules are not ionized. Some of the nitrogen (N₂) molecules may be present in a molecular state and some of the nitrogen (N₂) molecules may be present in an ionized state.

The ionized argon ions (Ar+) and nitrogen ions (N+) are accelerated toward the titanium (Ti) target sample 334, which functions as a negative pole, due to an electric field. The accelerated argon ions (Ar+) collide with the titanium (Ti) target sample 334 to transmit energy to the surface of the titanium (Ti) target sample 334. As a result, titanium (Ti) atoms rush out of the target sample 334. The titanium (Ti) atoms having high energy react with nitrogen injected into the second vacuum chamber 310 as represented by Equation 3 below to form a titanium nitride (TiN) hardness reinforcement layer 110 on the inner surface 100a of the bezel 100.

$$2Ti+N_2 \rightarrow 2TiN. \quad \text{Equation 3:}$$

Meanwhile, some of the ionized nitrogen ions (N+) accelerated toward the titanium (Ti) target sample 334 collide with the surface of the titanium (Ti) target sample 334 such that the nitrogen ions receive electrons and are thus neutralized (Equation 4(1)) and some of the ionized nitrogen ions (N+) react with titanium (Ti) to form titanium nitride (TiN) (Equation 4(2)).

$$N++- \rightarrow N \quad (1);$$

$$N+Ti \rightarrow TiN \quad (2). \quad \text{Equation 4:}$$

A DC power source, a pulsed DC power source, or an RF power source may be used as the second power supply unit 335. When the DC power source is used, the density of a deposited layer is low. When the RF power source is used, the titanium nitride (TiN) deposition speed is slow and thus a deposition rate is low. For this reason, the pulsed DC power source may be used as the second power supply unit 335.

The pulsed DC power source may have a voltage of more than 0 to 600 V. Power and deposition time may be properly controlled such that the hardness reinforcement layer 110 has a thickness of 1 to 500 nanometers.

In addition, the pulsed DC power source provides a higher deposition rate than the RF power source but a lower deposition rate than the DC power source. For this reason, at least one chamber having the same components and properties as the second vacuum chamber 310 may be further provided to deposit titanium nitride (TiN).

After the hardness reinforcement layer 110 is formed, the bezel 100 is moved along the rail 201 such that the bezel 100 is mounted in the third vacuum chamber 410 to deposit a color layer 120 on the hardness reinforcement layer 110 as shown in FIG. 3C. When the bezel 100 having the hardness reinforcement layer 110 deposited thereon is mounted in the third vacuum chamber 410, the mass flow meter 426 is controlled such that argon (Ar) is injected into the third vacuum chamber 410 while a vacuum state of the third vacuum chamber 410 is maintained by the vacuum pump 414.

Subsequently, plasma is generated according to the same principle as in the first vacuum chamber 210. Positively charged argon ions (Ar+) collide with the chromium (Cr) target sample 434. As a result, chromium (Cr) atoms rush out of the target sample 434 and are deposited on the hardness reinforcement layer 110 to form a color layer 120.

A DC power source, a pulsed DC power source, or an RF power source may be used as a third power supply unit 435. When the DC power source is used, the density of a deposited layer is low. When the RF power source is used, chromium (Cr) atoms deposition speed is slow. For this reason, the pulsed DC power source may be used as the third power supply unit 435.

The pulsed DC power source may have a voltage of more than 0 to 600 V. Power and deposition time may be properly controlled such that the color layer 120 has a thickness of 1 to 500 nanometers.

Hereinafter, a multilayer thin film manufacturing method according to another exemplary embodiment will be described in detail. The multilayer thin film manufacturing method according to this exemplary embodiment may further include depositing a passivation layer 130 on the color layer 120 after depositing the color layer 120 on the hardness reinforcement layer 110. More specifically, the multilayer thin film manufacturing method according to this exemplary embodiment may further include depositing a passivation layer 130 including polytetrafluoroethylene (PTFE) or silicon dioxide on the color layer 120. Hereinafter, a process of depositing a passivation layer 130 including PTFE will be described.

A fourth vacuum chamber (not shown) may be further provided at the sputtering deposition apparatus 200 shown in FIG. 1 to deposit the passivation layer 130.

The bezel 100 is moved and mounted in the fourth vacuum chamber to form the passivation layer 130. When the bezel 100 having the hardness reinforcement layer 110 and the color layer 120 deposited thereon is mounted in the fourth vacuum chamber, a mass flow meter is controlled such that argon (Ar) is injected into the fourth vacuum chamber while a vacuum state of the fourth vacuum chamber is maintained by a vacuum pump.

Subsequently, plasma is generated according to the same principle as in the first vacuum chamber 210 and third vacuum chamber 410. Positively charged argon ions (Ar+) collide with a PTFE target sample. As a result, PTFE rushes out of the target sample and is deposited on the color layer 120 to form a passivation layer 130.

Since PTFE is a nonconductor, an RF power source is used as a fourth power supply unit in the same manner in plasma processing. In a case in which silicon dioxide is deposited, the RF power source is used as the fourth power supply unit since the silicon dioxide is also a nonconductor.

In addition, power and deposition time may be properly controlled such that the passivation layer 130 has a thickness of 1 to 300 nanometers.

Meanwhile, the passivation layer 130 including PTFE or silicon dioxide has an anti-fingerprint function to prevent fingerprints from being left on a multilayer thin film and protects the multilayer thin film from physical scratches. For this reason, the passivation layer 130 may be formed on the color layer 120.

Next, an electronic product according to an exemplary embodiment will be described in detail.

The electronic product according to the exemplary embodiment includes a housing 100 having an outer surface 100b and an inner surface 100a and a multilayer thin film entirely or partially coupled to the inner surface 100a. The outer surface 100b of the housing means a surface exposed outward to form the external appearance of the electronic product and the inner surface 100a of the housing means a surface on which the multilayer thin film is deposited.

The housing 100 of the electronic product according to the exemplary embodiment may form the external appearance of at least one selected from a transparent product group consisting of a glass product, a plastic product, and a dual injected product. More specifically, the housing 100 is a box-shaped part, such as a case to receive parts or a frame to receive an instrument, which surrounds all mechanisms of the parts or the instrument. The housing 100 may include a housing accessory. The housing accessory may include a portion, such as a TV bezel, a TV stand, or a communication device bezel, forming the external appearance thereof or a part of the electronic product.

The multilayer thin film is formed at the inner surface 100a of the housing 100 or the housing accessory to provide a deep metal texture to the exterior of the electronic product. Hereinafter, the structure of a multilayer thin film formed at an inner surface 100a of a housing 100 of an electronic product according to an exemplary embodiment and an example of the electronic product according to the exemplary embodiment will be described in detail with reference to the accompanying drawings.

Figure 4:
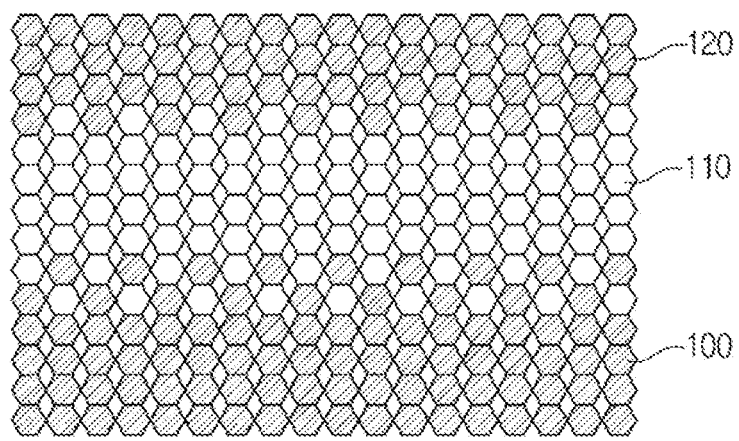
FIG. 4 is a view showing the structure of a multilayer thin film manufactured using the multilayer thin film manufacturing method according to an exemplary embodiment.
Figure 5:
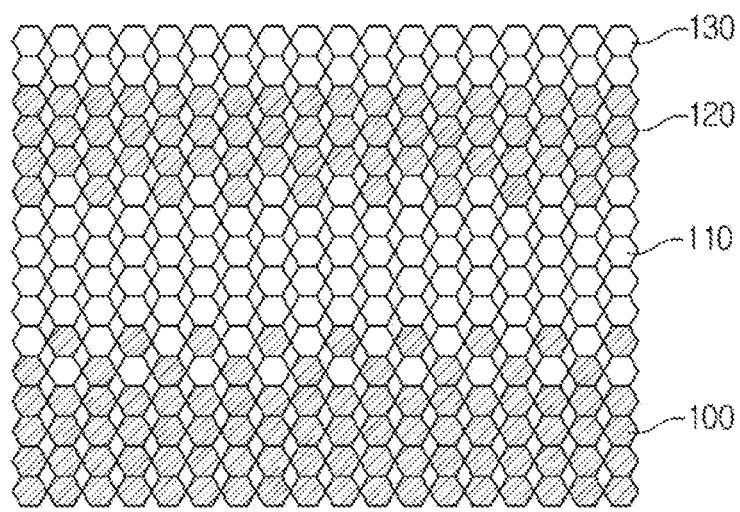
FIG. 5 is a view showing the structure of a multilayer thin film in which a passivation layer is further included in the structure shown in FIG. 4.

FIG. 4 is a view showing the structure of a multilayer thin film manufactured using the multilayer thin film manufacturing method according to the embodiment of the present invention and FIG. 5 is a view showing the structure of a multilayer thin film in which a passivation layer 130 is further included in the structure shown in FIG. 4.

Referring to FIG. 4, a multilayer thin film according to an exemplary embodiment may include at least one hardness reinforcement layer 110 coupled to the inner surface 100a of the housing and a color layer 120 coupled to the hardness reinforcement layer 110.

The hardness reinforcement layer 110 may include a first hardness reinforcement layer including chromium (Cr) coupled to the inner surface 100a of the housing and a second hardness reinforcement layer coupled to the first hardness reinforcement layer, the second hardness reinforcement layer including at least one selected from a group consisting of titanium nitride (TiN), chromium nitride (CrN), and aluminum nitride (AlN). In addition, the color layer 120 may include at least one selected from a group consisting of chromium (Cr), titanium (Ti), copper (Cu), gold (Au), and titanium nitride (TiN).

Referring to FIG. 5, a multilayer thin film according to another exemplary embodiment may further include a passivation layer 130 in the multilayer thin film shown in FIG. 4.

The passivation layer 130 may include at least one selected from a group consisting of polytetrafluoroethylene (PTFE) or silicon dioxide ($SiO_2$).

Figure 6A:
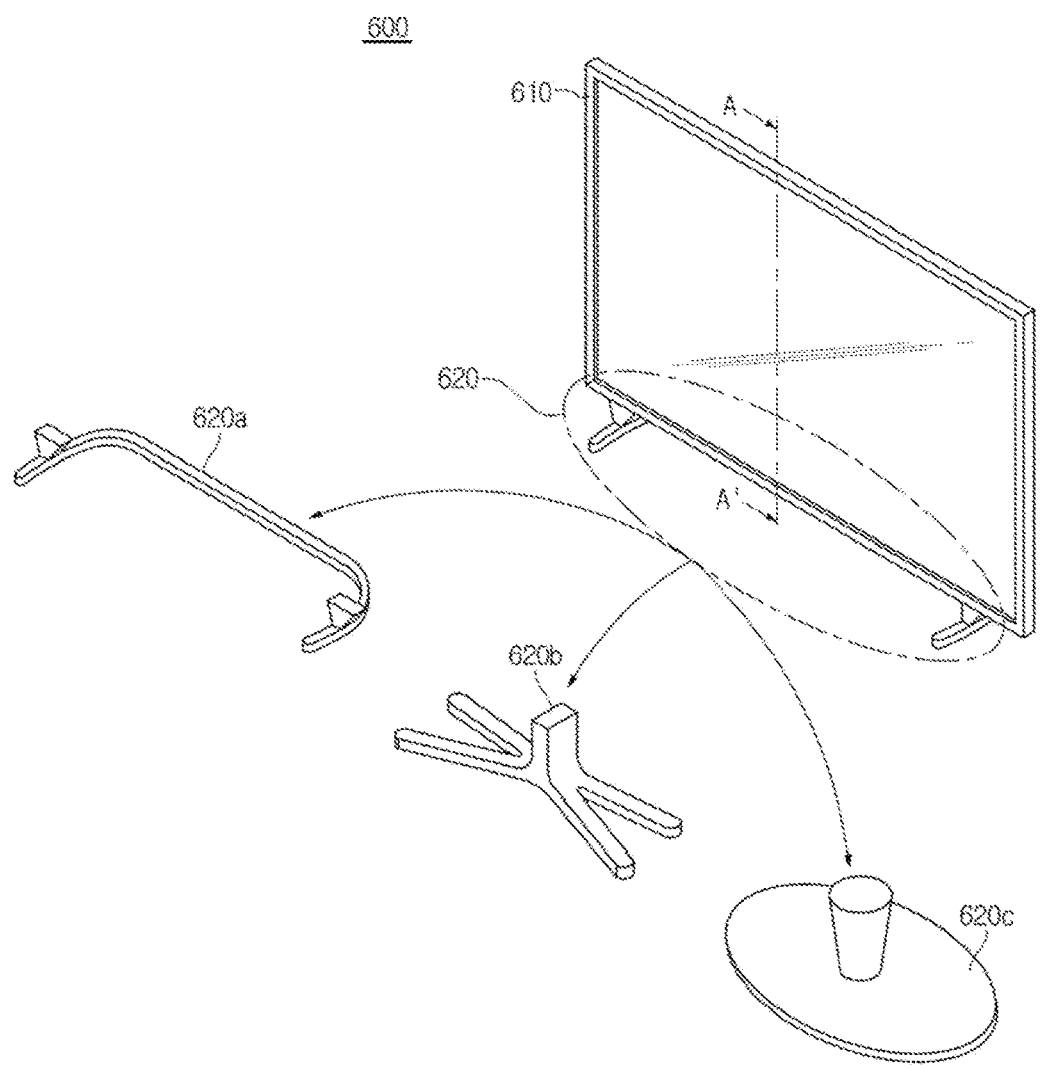
FIG. 6A is a view showing a TV including the multilayer thin film shown in FIG. 5 as an example of an electronic product according to an exemplary embodiment.

FIG. 6A is a view showing a television (TV) 600 including a housing on which the multilayer thin film shown in FIG. 4 is deposited, as an example of an electronic product according to an exemplary embodiment. As shown in FIG. 6A, the TV 600 may include a bezel 610 having a multilayer thin film formed thereon and stands 620a, 620b, and 620c each having a multilayer thin film formed thereon. The bezel 610 having the multilayer thin film formed thereon and stands 620a, 620b, and 620c each having the multilayer thin film formed thereon provide a deep metal texture to the exterior of the TV 600.

Figure 6B:
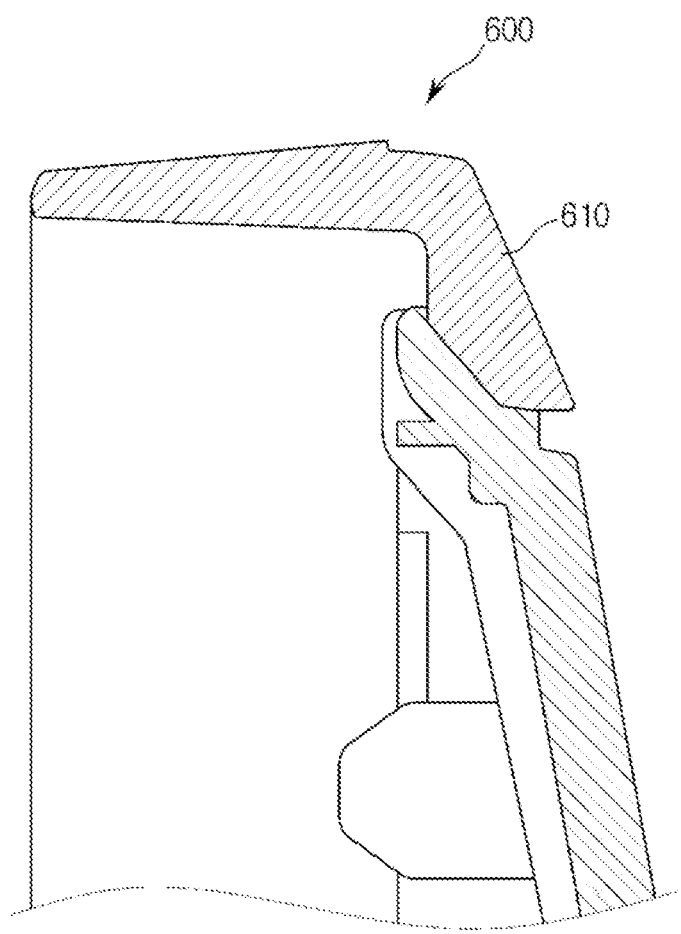
FIG. 6B is an enlarged view showing a bezel of the TV shown in FIG. 6A.

FIG. 6B is an enlarged sectional view taken along line A-A' of FIG. 6A showing the structure of the bezel 610 of the TV 600. As shown in FIG. 6B, the multilayer thin film is formed on the inside of the bezel 610 of the TV 600 to provide a deep metal texture to the exterior of the TV 600.

Figure 7:
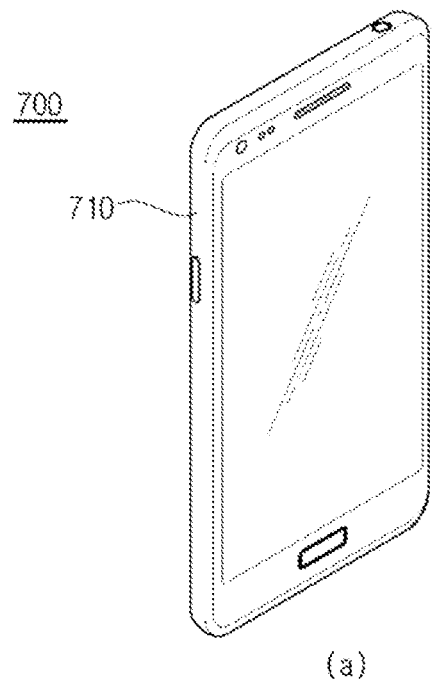
FIG. 7, view (a), is a perspective view showing a communication device including the multilayer thin film shown in FIG. 5 as an example of an electronic product according to another exemplary embodiment and (b) of FIG. 7 is a rear view the communication device shown in (a) of FIG. 7.
Figure 7:
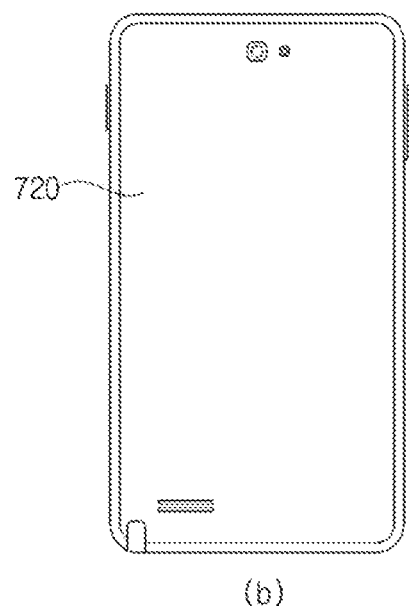

FIG. 7(a) is a perspective view showing a communication device 700 including a housing on which the multilayer thin film shown in FIG. 4 is deposited as an example of an electronic product according to another embodiment of the present invention and FIG. 7(b) is a rear view of FIG. 7(a). As shown in FIGS. 7(a) and 7(b), the housing forming the external appearance of the communication device 700 may include the multilayer thin film shown in FIG. 5. The housing on which the multilayer thin film shown is formed provides a deep metal texture to the exterior of the communication device 700. Meanwhile, the housing may include a bezel 710 of the communication device 700 and a case 720 of the communication device 700 as shown in FIGS. 7(a) and 7(b).

Figure 8:
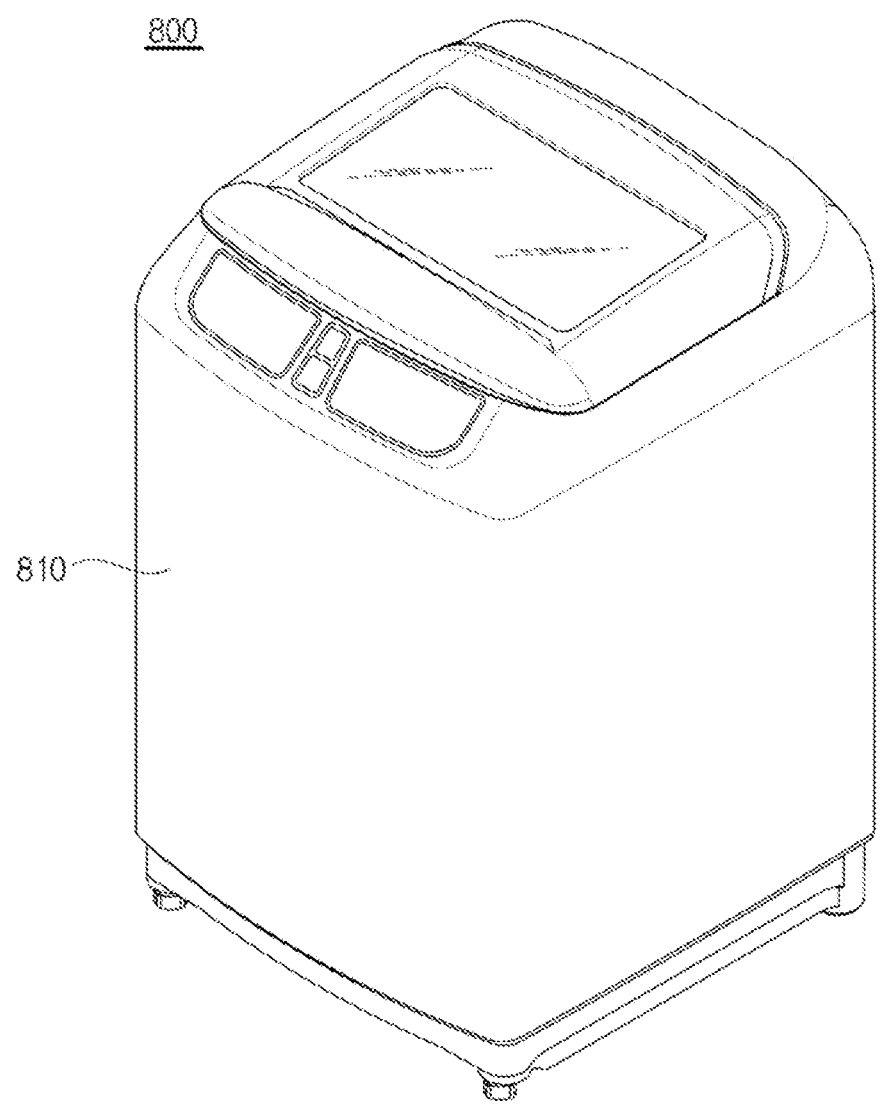
FIG. 8 is a view showing a washing machine including the multilayer thin film shown in FIG. 5 as an example of an electronic product according to another exemplary embodiment.

FIG. 8 is a view showing a washing machine 800, the external appearance of which is formed by a housing on which the multilayer thin film shown in FIG. 5 is deposited, as an example of an electronic product according to another exemplary embodiment.

As shown in FIG. 8, the housing 810 forming the external appearance of the washing machine 800 may include the multilayer thin film shown in FIG. 5. As a result, the housing on which the multilayer thin film shown is formed provides a deep metal texture to the exterior of the washing machine.

Figure 9:
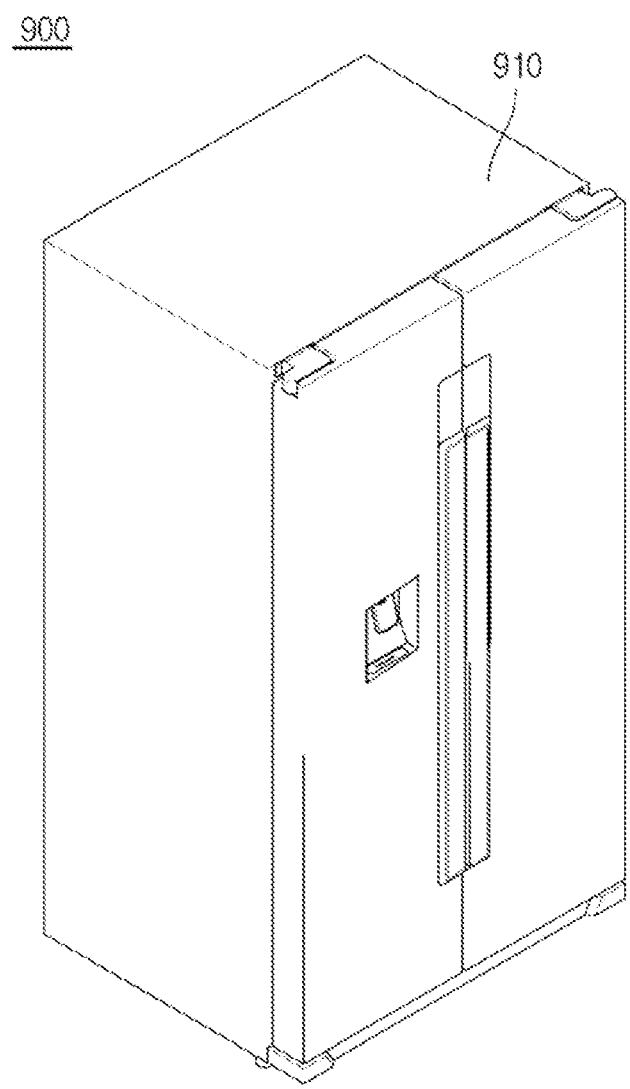
FIG. 9 is a view showing a refrigerator including the multilayer thin film shown in FIG. 5 as an example of an electronic product according to another exemplary embodiment.

FIG. 9 is a view showing a refrigerator 900, the external appearance of which is formed by a housing on which the multilayer thin film shown in FIG. 5 is deposited, as an example of an electronic product according to another exemplary embodiment.

As shown in FIG. 9, the housing 910 forming the external appearance of the refrigerator 900 may include the multilayer thin film shown in FIG. 5. As a result, the housing on which the multilayer thin film shown is formed provides a deep metal texture to the exterior of the refrigerator 900.

As is apparent from the above description, an electronic product and a multilayer thin film manufacturing method according to exemplary embodiments have the following effects.

First, a multilayer thin film shown is formed on the inner surface of a housing forming the external appearance of the electronic product, thereby providing a deep metal texture to the outside of the electronic product.

In addition, a sputtering deposition apparatus is used to provide a deep metal texture through a pure dry process and a process of masking the outer surface of the housing is omitted, thereby simplifying the multilayer thin film manufacturing method.

Although a few exemplary embodiments have been shown and described, it would be appreciated by those skilled in the art that changes may be made in these exemplary embodiments without departing from the principles and spirit thereof, the scope of which is defined in the claims and their equivalents.

What is claimed is:

1. A multilayer thin film manufacturing method comprising:
    reforming an inner surface of a housing having an outer surface and the inner surface through plasma processing;
    depositing at least one hardness reinforcement layer on the reformed inner surface;
    depositing a color layer on the hardness reinforcement layer; and
    depositing a passivation layer comprising at least one selected from a group consisting of polytetrafluoroethylene (PTFE) and silicon dioxide (SiO$_2$) on the color layer after depositing the color layer on the hardness reinforcement layer.

2. The multilayer thin film manufacturing method according to claim 1, further comprising: masking the outer surface of the housing before reforming the inner surface of the housing so that the housing is mounted in a multilayer thin film manufacturing apparatus.

3. The multilayer thin film manufacturing method according to claim 1, wherein the depositing the hardness reinforcement layer comprises:
depositing a first hardness reinforcement layer comprising chromium (Cr) on the inner surface; and
depositing a second hardness reinforcement layer comprising at least one selected from a group consisting of titanium nitride (TiN), chromium nitride (CrN), and aluminum nitride (AlN) on the first hardness reinforcement layer.

4. The multilayer thin film manufacturing method according to claim 3, wherein the depositing the first hardness reinforcement layer comprises:
providing a target sample comprising chromium (Cr); and
supplying power to the multilayer thin film manufacturing apparatus.

5. The multilayer thin film manufacturing method according to claim 3, wherein the depositing the second hardness reinforcement layer comprises:
providing a target sample comprising at least one selected from a group consisting of aluminum (Al), chromium (Cr), and titanium (Ti);
injecting a reaction gas comprising nitrogen (N$_2$); and
supplying power to the multilayer thin film manufacturing apparatus to cause the target sample and the reaction gas to react with each other.

6. A multilayer thin film manufacturing method, the method comprising:
reforming, by plasma processing, an inner surface of a housing having an outer surface and the inner surface;
depositing at least one hardness reinforcement layer on the deformed inner surface of a housing;
depositing a color layer on the hardness reinforcement layer; and
depositing a passivation layer comprising at least one selected from a group consisting of polytetrafluoroethylene (PTFE) and silicon dioxide (SiO$_2$) on the color layer after depositing the color layer on the hardness reinforcement layer,
wherein the depositing the at least one hardness reinforcement layer, the depositing the color layer and the depositing the passivation layer includes plasma processing.

7. The method of claim 6, wherein the depositing the at least one hardness reinforcement layer includes depositing a first hardness reinforcement layer on the inner surface, and
depositing a second hardness reinforcement layer on the first hardness reinforcement layer.

8. The method of claim 7, wherein the first hardness reinforcement layer includes chromium (Cr), and
the second hardness reinforcement layer includes at least one selected from a group consisting of titanium nitride (TiN), chromium nitride (CrN), and aluminum nitride (AlN).

9. The method of claim 6, wherein the housing comprises a bezel and wherein the passivation layer is formed in a vacuum chamber in which argon is injected and positively charged argon ions collide with a target sample, and a material for the passivation layer rushes out of the target sample and forms the passivation layer.

10. The method of claim 6, wherein the housing is formed to provide a metal texture through a pure dry process and wherein each layer is formed in an individual vacuum chamber.

11. The method of claim 6, wherein the film manufacturing method includes using a sputtering deposition apparatus.

12. The method of claim 6, further comprising fixing the outer surface of the housing by at least one jig isolating the outer surface from surrounding air instead of separately masking the outer layer of the housing and wherein the housing slides via railings into and out of a processing chamber while being fixed by the at least one jig in the processing chamber.

13. The method of claim 6, wherein the reforming of the inner surface of the housing through plasma processing comprises reforming the inner surface of the housing through plasma heating via a radio frequency power source and injecting of an argon, which is ionized therein.

* * * * *